United States Patent
Kuibira et al.

(10) Patent No.: US 7,211,153 B2
(45) Date of Patent: May 1, 2007

(54) CERAMIC JOINED BODY, SUBSTRATE HOLDING STRUCTURE AND SUBSTRATE PROCESSING APPARATUS

(75) Inventors: Akira Kuibira, Itami (JP); Masuhiro Natsuhara, Itami (JP); Hirohiko Nakata, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 77 days.

(21) Appl. No.: 10/276,394

(22) PCT Filed: Apr. 11, 2002

(86) PCT No.: PCT/JP02/03639

§ 371 (c)(1),
(2), (4) Date: Nov. 14, 2002

(87) PCT Pub. No.: WO02/083596

PCT Pub. Date: Oct. 24, 2002

(65) Prior Publication Data

US 2003/0150563 A1    Aug. 14, 2003

(30) Foreign Application Priority Data

Apr. 13, 2001  (JP) ............... 2001-115762

(51) Int. Cl.
    *H01L 21/00*    (2006.01)
    *C23C 16/00*    (2006.01)
(52) U.S. Cl. ................. 118/728; 118/725; 156/345.51; 156/345.52; 219/444.1; 219/544; 361/234; 279/128; 501/98.4; 501/98.6; 501/127; 501/152; 501/153

(58) Field of Classification Search ................ 118/725, 118/728; 156/345.51, 345.52; 219/444.1, 219/544; 361/234; 279/128; 501/98.4, 501/98.6, 127, 152, 153
See application file for complete search history.

(56) References Cited

U.S. PATENT DOCUMENTS 6,261,708 B1 *   7/2001   Ohashi et al. .............. 428/698

FOREIGN PATENT DOCUMENTS

| EP | 0 836221 | 4/1998 |
|----|----------|--------|
| JP | 04 078138 | 3/1992 |
| JP | 06 076924 | 3/1994 |
| JP | 7-050369 | 2/1995 |

(Continued)

*Primary Examiner*—Ram N. Kackar
(74) *Attorney, Agent, or Firm*—W. F. Fasse; W. G. Fasse

(57) ABSTRACT

A substrate holding structure having excellent corrosion resistance and airtightness, excellent dimensional accuracy and sufficient durability when mechanical or thermal stress is applied thereto is obtained. A holder (1) serving as the substrate holding structure includes a ceramic base (2) for holding a substrate, a protective cylinder (7) joined to the ceramic base (2) and a joining layer (8) positioned therebetween for joining the ceramic base (2) and the protective cylinder (7) to each other. The joining layer (8) contains at least 2 mass % and not more than 70 mass % of a rare earth oxide, at least 10 mass % and not more than 78 mass % of aluminum oxide, and at least 2 mass % and not more than 50 mass % of aluminum nitride. The rare earth oxide or the aluminum oxide has the largest proportional content among the aforementioned three types of components in the joining layer (8).

22 Claims, 2 Drawing Sheets

FOREIGN PATENT DOCUMENTS

| | | |
|---|---|---|
| JP | 10 242252 | 9/1998 |
| JP | 10242252 A * | 9/1998 |
| JP | 10-273370 | 10/1998 |
| JP | 11071184 A * | 3/1999 |
| JP | 11 349386 | 12/1999 |
| JP | 2000 216232 | 8/2000 |
| JP | 2000 239074 | 9/2000 |
| JP | 2001 010872 | 1/2001 |

* cited by examiner

CERAMIC JOINED BODY, SUBSTRATE HOLDING STRUCTURE AND SUBSTRATE PROCESSING APPARATUS

TECHNICAL FIELD

The present invention relates to a ceramic joined body, a substrate holding structure and a substrate processing apparatus, and more specifically, it relates to a ceramic joined body, a substrate holding structure and a substrate processing apparatus capable of implementing excellent airtightness and high dimensional accuracy.

BACKGROUND TECHNIQUE

In a fabrication process for a semiconductor device such as a semiconductor memory device or a liquid crystal display, a processing apparatus (the so-called single wafer processing apparatus) processing substrates one by one is generally employed for carrying out a film forming step of forming a prescribed film on the surface of a substrate such as a semiconductor substrate or a glass substrate to be processed or an etching step. In the fabrication process for a semiconductor device or a liquid crystal display, a plurality of processing apparatuses of the aforementioned single wafer processing type are set for transporting/supplying substrates to be processed to the processing apparatuses with a moving apparatus such as a loader. A substrate holder for receiving the substrate supplied by the loader is set on each processing apparatus. Film formation or etching is performed on the substrate received on the substrate holder.

A heater is set on the substrate holder for increasing the temperature of the substrate to a prescribed level. Further, an electrostatic attraction electrode may be formed on the substrate holder, in order to attract and fix the substrate to the substrate holder. Alternatively, a method of improving flatness of the surface (substrate receiving surface) for receiving the substrate in the substrate holder for adsorbing the substrate on the substrate receiving surface may be employed for fixing the substrate to the substrate holder.

In the aforementioned substrate holder, the substrate receiving surface and portions around the same are exposed to reaction gas for carrying out film formation or etching in the film formation step or the etching step on the substrate. Therefore, the component of the substrate holder must have sufficient corrosion resistance against such reaction gas (for example, halogen gas having high corrosiveness).

In the film formation or etching of the substrate, the substrate temperature may be increased to a relatively high level. Therefore, the substrate holder is required to have sufficient heat resistance in addition to the aforementioned corrosion resistance.

Thus, in consideration of corrosion resistance, heat resistance and durability, employment of not a metal or resin but ceramic is studied as to the material for the substrate holder. Among ceramic materials, aluminum oxide, which is relatively easy to fabricate and low-priced, is put into practice as the material for the substrate holder.

However, aluminum oxide has low thermal conductivity of about 30 W/mK, and hence it is difficult to precisely control the temperature such that temperature distribution on the substrate receiving surface of the substrate holder is dispersed when aluminum oxide is employed as the material for the substrate holder. In this case, the temperature of the substrate to be processed is also dispersed, and hence it may not be possible to homogeneously perform film formation or etching on the substrate. Consequently, the characteristics of the fabricated semiconductor device or liquid crystal display are disadvantageously dispersed.

In order to avoid this problem, aluminum nitride is noticed as the material for the substrate holder. This is because aluminum nitride is excellent in heat resistance and corrosion resistance, and has a high insulation property and high thermal conductivity.

A method of fabricating a substrate holder with aluminum nitride includes the following steps, for example: First, a compact is prepared from aluminum nitride powder. A coil or a wire consisting of a high melting point metal such as molybdenum is held in this compact. The coil or the wire serves as a heater or an electrostatic attraction electrode. Thereafter the compact is subjected to hot press sintering, thereby obtaining a substrate holder. This holder is disclosed in Japanese Patent Laying-Open No. 6-76924, for example. Japanese Patent Laying-Open No. 6-76924 discloses an embedded heater structure for improving the soaking property of the substrate holder.

When a heater or an electrode is embedded in the substrate holder, power must be supplied to the heater or the electrode from outside the substrate holder. Therefore, an electrode wire connected to the heater or the electrode to outwardly extend from the substrate holder is set on the substrate holder. Further, a temperature measuring member such as a thermocouple or a sensor measuring the temperature of the substrate holder is set on the substrate holder for controlling the temperature of the substrate holder.

The electrode wire or the temperature measuring member may be corroded by reaction gas (for example, halogen-based gas) employed for substrate processing (film formation, etching, cleaning etc.). Therefore, the electrode wire or the temperature measuring member must be protected against the reaction gas in a chamber. Thus, a protective member reliably separating the reaction gas in the chamber and a region provided with the electrode wire or the like from each other is set on the substrate holder. The electrode wire or the temperature measuring member is arranged in the inner part of the protective member. This protective member must have high corrosion resistance against the reaction gas such as halogen gas and high airtightness. In particular, the junction between the protective member and the substrate holder must be subjected to airtight joining.

As a method of joining the protective member to the substrate holder in the aforementioned manner, Japanese Patent Laying-Open No. 4-78138, for example, shows a method of joining a cylindrical protective member consisting of aluminum nitride, silicon nitride, alumina or stainless steel to the back surface of a substrate holder by glass joining or brazing.

As another method of joining a substrate holder and a protective member to each other, a method of diffusion-joining a substrate holder consisting of aluminum nitride and a pipelike protective member consisting of aluminum nitride to each other by hot pressing is also known.

Japanese Patent Laying-Open No. 10-242252 discloses a technique of joining a substrate holder and a protective member consisting of aluminum nitride to each other with a joining layer mainly composed of aluminum nitride and containing a rare earth oxide, a shown in FIG. 4. FIG. 4 is a schematic sectional view showing a conventional holder consisting of a substrate holder and a protective member. Referring to FIG. 4, a ceramic base 102 including resistance heating elements 106 and a substrate base 103 and a protective cylinder 107 serving as a protective member are joined to each other with a joining layer 108 in the conventional holder 101. This gazette lists $Y_2O_3$, $CeO_2$ or $Er_2O_3$ as a rare earth oxide contained in the joining layer 108, and states that the content of this rare earth oxide is 3 to 20 mass %.

As a technique relevant to the aforementioned technique in the point joining members consisting of aluminum nitride to each other, Japanese Patent Laying-Open No. 7-50369 discloses a technique of joining a base and a fin part consisting of aluminum nitride to each other with a joining material mainly composed of aluminum nitride. As to the composition of the joining material, the ratio of aluminum nitride to $Y_2O_3$ is exemplarily set to 97:3.

When a substrate to be processed is set on a substrate holding structure so that etching or film formation is performed on this substrate, the substrate holding structure is used under such severe environment that the temperature thereof is increased or the substrate holding structure is exposed to plasma or halogen gas employed for the aforementioned etching or the like. The substrate holding structure must maintain its strength or the like also under such severe environment. Therefore, the junction between the substrate holder and the protective member must also have sufficient corrosion resistance and heat resistance against the aforementioned plasma or halogen gas.

When foreign matter such as a trace amount of particles is present in the chamber in substrate processing, the foreign matter exerts bad influence on the substrate processing. Consequently, a failure may result from the foreign matter in the fabricated semiconductor device or liquid crystal display. Therefore, the substrate holding structure must not cause the aforementioned foreign matter. Thus, the junction between the substrate holder and the protective member is also required to have excellent corrosion resistance not to cause such a problem that the junction is damaged following substrate processing to result in foreign matter such as particles.

From this point of view, the aforementioned conventional substrate holding structure has the following problems: The metal employed for the junction in glass joining or brazing shown in Japanese Patent Laying-Open No. 4-78138 is generally inferior in corrosion resistance and has a relatively low melting point. Therefore, the metal reacts with corrosive gas such as halogen gas employed for processing the substrate, to cause foreign matter such as particles.

When diffusion-joined by hot pressing, the substrate holder and the protective member are joined to each other at a high temperature with a high load of about 9.8 to 29.4 MPa (100 to 300 kgf/cm$^2$) applied to the junction. Thus, dimensional accuracy of the substrate holder may be deteriorated due to deformation through the hot pressing step. When such a hot pressing step is utilized, the cost for equipment necessary for fabricating the substrate holding structure or for executing the fabrication process is disadvantageously increased.

When a joining layer mainly composed of aluminum nitride and containing a rare earth oxide as in the technique disclosed in Japanese Patent Laying-Open No. 10-242252, the joining layer containing 3 to 20 mass % of the rare earth oxide such as $Y_2O_3$ as hereinabove described must be sintered at a high temperature of at least 1800° C. for joining the substrate holder and the protective member to each other. The temperature of at least 1800° C. is equivalent to a sintering temperature for forming the substrate holder consisting of aluminum nitride. Therefore, the substrate holder may be deformed due to the heat treatment under the high temperature of at least 1800° C. for joining the substrate holder and the protective member to each other with the aforementioned joining layer. In the stage of joining the protective member, the substrate holder is already provided therein with a heater or an electrode, and the shape and the dimension of the substrate holder are precisely set by machining or the like. If the substrate holder is deformed by the heat treatment for joining with the aforementioned joining layer, therefore, the shape of the finally obtained substrate holding structure is deformed. This results in a problem such that temperature distribution in the substrate holding structure differs from the designed distribution (the soaking property is deteriorated) due to the deformation of the substrate holding structure.

The joining layer mainly composed of aluminum nitride is densified by sintering. In the heat treatment for joining, therefore, no such phenomenon that the joining layer flows along irregularities of the surfaces of the substrate holder and the protective member coming into contact with the joining layer in the joined portions remarkably takes place in the heat treatment for joining. When the heat treatment for joining is performed, without particularly applying a load to the joining layer and the joined substances (the substrate holder and the protective member), therefore, such an effect that the joining layer fills up clearances resulting from the aforementioned irregularities is not much attained. The joining layer obtained in this manner is inferior in airtightness due to a large number of clearances. In order to protect the electrode wire against halogen gas or the like in the chamber with the protective member, the protective member including the joining layer must have sufficiently high airtightness (it is assumed that a helium (He) leak rate must be less than $10^{-8}$ Pa·m$^3$/s). In order to implement such high airtightness, heating must be performed while crushing clearances of the joining layer by hot pressing in the heat treatment (the heat treatment for joining) on the joining layer. The heat treatment is performed while applying a load to the joining layer in this manner, and hence the problem that the substrate holder is deformed in this heat treatment particularly remarkably takes place as described above.

Further, mechanical or thermal stress is readily applied to the junction between the substrate holder and the protective member forming the substrate holding structure due to handling such as portage of the substrate holding structure or attachment to or detachment from an apparatus or thermal stress resulting from heating/cooling in a case of mounting the substrate holding structure on the apparatus in practice and using the same. Therefore, the junction must have sufficient strength (practically the bending strength in the junction must be at least 147 MPa (15 kgf/mm$^2$) in four-point bending strength according to JIS).

The technique disclosed in Japanese Patent Laying-Open No. 7-50369, related to a ceramic radiator for a semiconductor comprising a base and a fin part consisting of aluminum nitride, belongs to a technical field different from that of the present invention and does not particularly require airtightness. Even if the technique disclosed in Japanese Patent Laying-Open No. 7-50369 can be applied to joining between a substrate holder and a protective member of a substrate holding structure, problems similar to those in the aforementioned Japanese Patent Laying-Open No. 10-242252 take place.

The present invention has been proposed in order to solve the aforementioned problems, and an object of the present invention is to provide a ceramic joined body and a substrate holding structure having excellent corrosion resistance and airtightness, having excellent dimensional accuracy and having sufficient durability upon application of mechanical or thermal stress and a substrate processing apparatus comprising the same.

DISCLOSURE OF THE INVENTION

The inventors have made deep studies as to a joining layer for joining a ceramic base and an airtight sealing member in a substrate holding structure to each other, to complete the present invention. The present invention is now described.

The joining layer desirably has sufficient airtightness after joining, with high corrosion resistance against reaction gas such as halogen-based gas or cleaning gas. From the viewpoint of corrosion resistance, aluminum nitride or aluminum oxide having sufficient corrosion resistance is preferable as the material for the joining layer. However, aluminum nitride has no melting point but sublimates at a high temperature of at least 2000° C. Further, the melting point of aluminum oxide is at least 2000° C. Therefore, it is difficult to prepare the joining layer from the simple substance of aluminum nitride or aluminum oxide.

While a sintering assistant is added for sintering aluminum nitride, a sintering assistant containing an alkaline earth element is known as such a sintering assistant. However, the alkaline earth element belongs to an element group avoided as foreign matter particularly in semiconductor fabrication. Therefore, the sintering assistant containing the alkaline earth element cannot be used. When sintering aluminum nitride without employing the sintering assistant containing the alkaline earth element, the sintering temperature is about 1800° C. to 2000° C. in general. When the ceramic base and the airtight sealing member joined to each other with the joining layer are formed by sintered bodies of aluminum nitride, heat treatment for joining must be performed at a temperature lower than the sintering temperatures (1800° C. to 2000° C.) for the sintered bodies in a non-pressurized state (applied pressure is not more than 0.1 MPa (1 kgf/cm$^2$)) applying no load to the joining layer in order to prevent the ceramic base and the airtight sealing member from being deformed by the heat treatment for joining.

The rare earth oxide (for example, $Y_2O_3$, $CeO_2$, $Er_2O_3$, $Nd_2O_3$, $Sm_2O_3$ or the like) forms a eutectic crystal with aluminum oxide, and hence the melting point of the aluminum oxide containing the rare earth oxide is reduced. Therefore, it is preferable to employ the aluminum oxide and the rare earth oxide as the main components of the joining layer. However, if yttrium oxide ($Y_2O_3$) is added to the aluminum oxide to provide a eutectic composition, for example, the melting point thereof is about 1760° C. In practice, the joining layer must be heated to a high temperature exceeding 1800° C. in order to homogenously join the overall joining layer when employing this aluminum oxide containing yttrium oxide as the material for the joining layer. Under this temperature condition, there is still a possibility that a failure such as deformation of the ceramic base or the like takes place.

Therefore, the inventors have studied various compositions for the joining layer, to find out that the melting point of the joining layer can be further reduced by further adding aluminum nitride to the aforementioned joining layer containing the aluminum oxide and the rare earth oxide. In this case, it was possible to set the heat treatment temperature for joining to about 1650° C. to 1800° C.

However, it has been proved by an experiment by the inventors that a large number of clearances are defined in the joining layer to reduce airtightness if the content of the aluminum nitride is excessively increased. More specifically, it has been recognized that airtightness of the joining layer obtained by performing the heat treatment for joining in the non-pressurized state is reduced if the aluminum nitride has the largest content among the rare earth oxide, the aluminum oxide and the aluminum nitride in the joining layer. Therefore, it has been recognized that either the rare earth oxide or the aluminum oxide must be set to the largest ratio for attaining flowability.

As a result of further progressing studies as to the content of the aluminum nitride, the inventors have found out that a joining layer exhibiting sufficient airtightness and having high strength can be formed only when the content of aluminum nitride is controlled to set the ratio of aluminum nitride to at least 2 mass % and not more than 50 mass %. In other words, the aluminum nitride forms a ternary melt along with the simultaneously added rare earth oxide and aluminum oxide in joining at the high temperature as a first process of forming the joining layer when the aluminum nitride is set to the aforementioned content. Clearances of the joining layer can be substantially completely eliminated due to viscous flow of the melt. Therefore, a joining layer having no helium (He) leak (the He leak rate is less than $1.0 \times 10^{-8}$ Pa·m$^3$/s) can be formed after joining.

Then, aluminum nitride grains re-precipitate from the melt of the rare earth oxide, the aluminum oxide and the aluminum nitride serving as a joining material as a second process in a cooling process from the aforementioned high-temperature state. Consequently, the joining layer is filled up not only with a glass layer but also with a ceramic layer consisting of the aforementioned precipitating aluminum nitride grains. Therefore, the value of the thermal expansion coefficient of the joining layer can approach the value of the thermal expansion coefficient of the matrix (the object of joining), and hence thermal stress applied to the joining layer in heating/cooling can be reduced. The joining layer is filled up with ceramic grains of the aluminum nitride grains, whereby grain boundary strength of the joining layer can be improved.

According to the inventors' studies, a counterbored groove may be previously formed in either one of the ceramic base and the airtight sealing member on the junction between the ceramic base and the airtight sealing member. The other one of the ceramic base and the airtight sealing member may be engaged in this counterbored groove. In this case, the joining material for forming the joining layer can be prevented from vaporization, whereby uneven joining can bell prevented. When the joining layer is subjected to transverse stress, this stress concentrates to a single point and hence the joining layer is readily broken from the stress concentration part. If the counterbored groove is formed, however, the side surface of the counterbored groove receives the transverse stress and hence the stress can be inhibited from concentrating to a single point. Consequently, joining strength of the joining layer is improved.

The inventors have made an experiment by varying the content of the aluminum nitride, to obtain the following recognition: When the content of the aluminum nitride exceeded 50 mass %, part of the aluminum nitride formed a liquid phase along with the rare earth oxide and the aluminum oxide to reduce the melting point if the aluminum nitride was added to the rare earth oxide and the aluminum oxide. However, the most part of the aluminum nitride remained forming no liquid phase. Thus, flowability was lost in the joining layer in heat treatment. In this case, the joining layer could not sufficiently fill up clearances between the joining layer and the ceramic base and the airtight sealing member, and hence the clearances partially remained also after the heat treatment. Consequently, airtightness was reduced on the junction.

On the basis of the aforementioned recognition of the inventors, a substrate holding structure according to a first aspect of the present invention is a substrate holding structure holding a substrate when processing the substrate, and comprises a ceramic base for holding the substrate, an airtight sealing member joined to the ceramic base and a joining layer positioned between the ceramic base and the airtight sealing member for joining the ceramic base and the airtight sealing member to each other. The joining layer contains at least 2 mass % and not more than 70 mass % of a rare earth oxide, at least 10 mass % and not more than 78 mass % of aluminum oxide and at least 2 mass % and not more than 50 mass % of aluminum nitride. In the joining layer, the rare earth oxide or the aluminum oxide has the largest ratio among the three types of components (the rare earth oxide, the aluminum oxide and the aluminum nitride).

A substrate holding structure according to a second aspect of the present invention is a substrate holding structure holding a substrate when processing the substrate, and comprises a ceramic base for holding the substrate, an airtight sealing member joined to the ceramic base and a joining layer positioned between the ceramic base and the airtight sealing member for joining the ceramic base and the airtight sealing member to each other, similarly to the substrate holding structure according to the aforementioned first aspect. The joining layer is formed by heating/calcining a joining material containing at least 2 mass % and not more than 70 mass % of a rare earth oxide, at least 10 mass % and not more than 78 mass % of aluminum oxide and at least 2 mass % and not more than 50 mass % of aluminum nitride. In the joining layer, the rare earth oxide or the aluminum oxide has the largest ratio among the aforementioned three types of components (the rare earth oxide, the aluminum oxide and the aluminum nitride).

Thus, in the joining layer mainly composed of the aluminum oxide and the rare earth oxide as the materials for the joining layer with addition of the aluminum nitride, the melting point can be sufficiently reduced. Therefore, heat treatment for joining with the joining layer can be performed under a lower temperature condition than the prior art in a state reducing a load applied to the joining layer as compared with the prior art. Consequently, such a failure can be prevented that the ceramic base of the substrate holding structure is deformed by this heat treatment for joining. Further, airtightness of the obtained joining layer can also be kept sufficiently excellent. More specifically, a substrate holding structure having no leak (the He leak rate is less than $10^{-8}$ Pa·m$^3$/s) can be obtained. In such a substrate holding structure, a leak incidence after a heat cycle of 700° C., for example, can also be remarkably reduced. Further, a failure such as heterogeneous joining in the joining layer can be suppressed.

The content of the rare earth oxide in the joining layer (or the joining material) is set to at least 2 mass % since wettability with respect to the surfaces of the ceramic base and the airtight sealing member can be developed in the joining layer in this case. The content of the rare earth oxide in the joining layer (or the joining material) is set to not more than 70 mass % since flowability for filling up irregular portions on the surfaces of the ceramic base and the like or clearances in the joining layer is reduced in the joining layer to reduce airtightness of the formed joining layer if the content of the rare earth oxide in the joining layer exceeds 70 mass %.

The content of the aluminum oxide in the joining layer (or the joining material) is set to at least 10 mass % since a liquid phase of a composite oxide of the aluminum oxide and the rare earth oxide can be formed in the joining layer at a relatively low temperature in the heat treatment for joining in this case. Consequently, the ceramic base and the airtight sealing member can be joined to each other with the joining layer. The content of the aluminum oxide in the joining layer (or the joining material) is set to not more than 78 mass % since the liquid phase forming temperature on the joining layer is disadvantageously increased such that the ceramic base and the airtight sealing member cannot be joined to each other at a sufficiently low temperature if the content of the aluminum oxide exceeds 78 mass %.

The content of the aluminum nitride in the joining layer (or the joining material) is set to at least 2 mass % since an effect of reducing the temperature for forming the liquid phase in the heat treatment for joining can be attained in the joining layer and the joining strength of the joining layer can be improved due to reprecipitation of aluminum nitride grains from the liquid phase in a cooling process in this case. In other words, the aluminum nitride grains reprecipitate from the liquid phase in the cooling process, whereby the joining layer can be reinforced and the thermal expansion coefficient of the joining layer can approach the thermal expansion coefficient of the matrix ceramic (the ceramic forming the ceramic base or the like). Consequently, the joining strength of the joining layer can be improved. The content of the aluminum nitride in the joining layer (or the joining material) is set to less than 50 mass % since flowability in the joining layer is reduced in the heat treatment for joining if the content of the aluminum nitride exceeds 50 mass %. If the flowability is thus reduced, clearances are defined in the formed joining layer and hence sufficient airtightness cannot be ensured.

The rare earth oxide or the aluminum oxide is set to the largest ratio in the joining layer (i.e., the joining layer is mainly composed of the rare earth oxide or the aluminum oxide) since a large number of clearances are defined in the joining layer and airtightness of the joining layer cannot be ensured in a non-pressurized state in the heat treatment for joining if the joining layer is mainly composed of the aluminum nitride. The total proportion of the rare earth oxide and the aluminum oxide may be set to at least 50 mass % in the joining layer.

In the substrate holding structure according to the aforementioned first aspect, it is preferable that the content of the rare earth oxide is at least 10 mass % and not more than 50 mass %, the content of the aluminum oxide is at least 30 mass % and not more than 70 mass %, and the content of the aluminum nitride is at least 10 mass % and not more than 30 mass % in the joining layer.

In the substrate holding structure according to the aforementioned second aspect, the joining layer is preferably formed by heating/calcining a joining material containing at least 10 mass % and not more than 50 mass % of a rare earth oxide, at least 30 mass % and not more than 70 mass % of aluminum oxide and at least 10 mass % and not more than 30 mass % of aluminum nitride.

In this case, the melting point of the joining layer can be reliably lowered as compared with the prior art. Therefore, heat treatment for joining with the joining layer can be performed under a lower temperature condition than the prior art in a state reducing a load applied to the joining layer as compared with the prior art. Consequently, such a failure can be reliably prevented that the ceramic base of the substrate holding structure is deformed by this heat treatment for joining.

The content of the rare earth oxide in the joining layer (or the joining material) is set to at least 10 mass % since wettability with respect to the surfaces of the ceramic base and the airtight sealing member is particularly remarkably developed in the joining layer in this case. The content of the rare earth oxide in the joining layer (or the joining material) is set to not more than 50 mass % since viscosity of a liquid phase in the joining layer is so increased in the heat treatment that flowability of this liquid phase starts to lower if the content of the rare earth oxide in the joining layer exceeds 50 mass %.

The content of the aluminum oxide in the joining layer (or the joining material) is set to at least 30 mass % since the temperature for forming a liquid phase of a composite oxide of aluminum oxide and the rare earth oxide can be remarkably reduced in the joining layer in the heat treatment for joining in this case. The content of the aluminum oxide in the joining layer (or the joining material) is set to not more than 70 mass % since a liquid phase forming temperature in the joining layer is increased to reduce flowability of the liquid phase if the content of the aluminum oxide exceeds 70 mass %.

The content of the aluminum nitride in the joining layer (or the joining material) is set to at least 10 mass % since an effect of reducing the temperature for forming the liquid phase remarkably appears in the joining layer in the heat treatment for joining in this case. The content of the aluminum nitride in the joining layer (or the joining material) is set to 30 mass % since flowability in the joining layer is remarkably improved in the heat treatment for joining if the content of the aluminum nitride is not more than 30 mass %.

In the substrate holding structure according to the aforementioned first or second aspect, the ceramic base may have an electric circuit. The substrate holding structure according to the aforementioned first or second aspect may further comprise a feeding conductive member connected to the electric circuit of the ceramic base. The airtight sealing member is preferably arranged to enclose the feeding conductive member.

In this case, the airtight sealing member for protecting the feeding conductive member is joined to the ceramic base with no leak, whereby the inner part of the airtight sealing member can be prevented from external penetration of reaction gas or the like. Consequently, such a failure can be reliably prevented that the feeding conductive member is corroded by reaction gas or the like outside the substrate holding structure.

A substrate processing apparatus according to a third aspect of the present invention comprises the substrate holding structure according to the aforementioned first or second aspect.

In this case, a problem such as corrosion of the feeding conductive member by reaction gas or dispersion of temperature distribution of a substrate resulting from deformation of the ceramic base can be prevented in the substrate processing apparatus by employing the substrate holding structure having neither leak nor deformation.

A ceramic joined body according to a fourth aspect of the present invention comprises a first ceramic body, a second ceramic body joined to the first ceramic body and a joining layer positioned between the first ceramic body and the second ceramic body for joining the first ceramic body and the second ceramic body to each other. The joining layer contains at least 2 mass % and not more than 70 mass % of a rare earth oxide, at least 10 mass % and not more than 78 mass % of aluminum oxide and at least 2 mass % and not more than 50 mass % of aluminum nitride. In the joining layer, the rare earth oxide or the aluminum oxide has the largest ratio among the aforementioned three types of components (the rare earth oxide, the aluminum oxide and the aluminum nitride).

A ceramic joined body according to a fifth aspect of the present invention comprises first and second ceramic bodies and a joining layer positioned between the first and second ceramic bodies for joining the first and second ceramic bodies to each other, similarly to the ceramic joined body according to the aforementioned fourth aspect. The joining layer is formed by heating/calcining a joining material containing at least 2 mass % and not more than 70 mass % of a rare earth oxide, at least 10 mass % and not more than 78 mass % of aluminum oxide and at least 2 mass % and not more than 50 mass % of aluminum nitride. In the joining layer, the rare earth oxide or the aluminum oxide has the largest ratio among the aforementioned three types of components (the rare earth oxide, the aluminum oxide and the aluminum nitride).

Thus, the melting point can be sufficiently reduced in the joining layer mainly composed of the aluminum oxide and the rare earth oxide as the materials for the joining layer with addition of the aluminum nitride. Therefore, heat treatment for joining with the joining layer can be performed under a lower temperature condition than the prior art in a state reducing a load applied to the joining layer as compared with the prior art. Consequently, such a failure can be prevented that the first and second ceramic bodies are deformed by the heat treatment for joining. Further, airtightness of the obtained joining layer can also be kept sufficiently excellent. More specifically, a ceramic joined body having no leak (the He leak rate is less than $10^{-8}$ Pa·m$^3$/s) can be obtained. Further, a failure such as heterogeneous joining in the joining layer can be suppressed.

The content of the rare earth oxide in the joining layer (or the joining material) is set to at least 2 mass % since wettability with respect to the surfaces of the first and second ceramic bodies can be developed in the joining layer in this case. The content of the rare earth oxide in the joining layer (or the joining material) is set to not more than 70 mass % since flowability for filling up irregular portions on the surfaces of the first and second ceramic bodies or clearances in the joining layer is reduced in the joining layer to reduce airtightness of the formed joining layer if the content of the rare earth oxide in the joining layer exceeds 70 mass %.

The content of the aluminum oxide in the joining layer (or the joining material) is set to at least 10 mass % since a liquid phase of a composite oxide of the aluminum oxide and the rare earth oxide can be formed in the joining layer at a relatively low temperature in heat treatment for joining in this case. Consequently, the first and second ceramic bodies can be joined to each other with the joining layer. The content of the aluminum oxide in the joining layer (or the joining material) is set to not more than 78 mass % since the liquid phase forming temperature is disadvantageously increased in the joining layer and the first and second ceramic bodies cannot be joined to each other at a sufficiently low temperature if the content of the aluminum oxide exceeds 78 mass %.

The content of the aluminum nitride in the joining layer (or the joining material) is set to at least 2 mass % for the following reason: When setting the content of the aluminum nitride to at least 2 mass % as hereinabove described, an effect of reducing the temperature for forming the liquid phase can be attained in the joining layer in the heat treatment for joining. Further, aluminum nitride grains reprecipitate from a liquid layer in a cooling process, whereby the joining layer can be reinforced and the thermal expansion coefficient of the joining layer can approach the thermal expansion coefficient of the matrix ceramic (the ceramic forming the first and second ceramic bodies). Consequently, joining strength of the joining layer can be improved. The content of the aluminum nitride in the joining layer (or the joining material) is set to less than 50 mass % since flowability in the joining layer is reduced in the heat treatment for joining if the content of the aluminum nitride exceeds 50 mass %. When the flowability is reduced, clearances are defined in the formed joining layer and hence sufficient airtightness cannot be ensured.

The rare earth oxide or the aluminum oxide is set to the largest ratio or proportion in the joining layer since a large number of clearances are defined in the joining layer and airtightness of the joining layer cannot be ensured in a non-pressurized state in the heat treatment for joining if the joining layer is mainly composed of the aluminum nitride. In the joining layer, the total proportion of the rare earth oxide and the aluminum oxide may be set to at least 50 mass %.

In the ceramic joined body according to the fourth aspect, it is preferable that the content of the rare earth oxide is at least 10 mass % and not more than 50 mass %, the content of the aluminum oxide is at least 30 mass % and not more than 70 mass % and the content of the aluminum nitride is at least 10 mass % and not more than 30 mass % in the joining layer.

In the ceramic joined body according to the aforementioned fifth aspect, the joining layer is preferably formed by heating/calcining the joining material containing at least 10 mass % and not more than 50 mass % of the rare earth oxide, at least 30 mass % and not more than 70 mass % of the aluminum oxide and at least 10 mass % and not more than 30 mass % of the aluminum nitride.

In this case, the melting point of the joining layer can be reliably reduced as compared with the prior art. Therefore, heat treatment for joining with the joining layer can be performed under a lower temperature condition than the prior art in a state reducing a load applied to the joining layer as compared with the prior art. Consequently, such a failure can be reliably prevented that the first or second ceramic body is deformed by the heat treatment for joining.

The content of the rare earth oxide in the joining layer (or the joining material) is set to at least 10 mass % since wettability with respect to the surface of the first or second ceramic body particularly remarkably appears in the joining layer in this case. The content of the rare earth oxide in the joining layer (or the joining material) is set to not more than 50 mass % since viscosity of a liquid phase is increased in the joining layer in the heat treatment and flowability of this liquid phase starts to lower if the content of the rare earth oxide in the joining layer exceeds 50 mass %.

The content of the aluminum oxide in the joining layer (or the joining material) is set to at least 30 mass % since the temperature for forming a liquid phase of a composite oxide of the aluminum oxide and the rare earth oxide can be remarkably reduced in the joining layer in the heat treatment for joining in this case. The content of the aluminum oxide in the joining layer (or the joining material) is set to not more than 70 mass % since the liquid phase forming temperature is increased in the joining layer to reduce flowability of the liquid phase if the content of the aluminum oxide exceeds 70 mass %.

The content of the aluminum nitride in the joining layer (or the joining material) is set to a least 10 mass % since an effect of reducing the temperature forming the liquid phase is remarkably attained in the joining layer in the heat treatment for joining. The content of the aluminum nitride in the joining layer (or the joining material) is set to not more than 30 mass % since flowability in the joining layer is remarkably improved in the heat treatment for joining if the content of the aluminum nitride is not more than 30 mass %.

In the substrate holding structure according to the aforementioned first or second aspect or in the ceramic joined body according to the aforementioned fourth or fifth aspect, a helium (He) leak rate may be less than $1.0 \times 10^{-8}$ Pa·m$^3$/s and four-point bending strength according to JIS may be at least 147 MPa (15 kgf/mm$^2$) as to the joining layer. The joining layer preferably contains aluminum nitride grains formed by precipitation of the aluminum nitride resulting from dissolution-reprecipitation.

In the substrate holding structure according to the aforementioned first or second aspect, a counterbored groove may be formed in either one of the ceramic base and the airtight sealing member on the junction between the ceramic base and the airtight sealing member, and the ceramic base and the airtight sealing member may be joined to each other while the other one of the ceramic base and the airtight sealing member is engaged in the counterbored groove. In the ceramic joined body according to the aforementioned fourth or fifth aspect, a counterbored groove may be formed in either one of the first and second ceramic bodies on the junction between the said first ceramic body and the said second ceramic body, and the first and second ceramic bodies may be joined to each other while the other one of the first and second ceramic bodies is engaged in the counterbored groove.

In this case, airtightness and strength can be sufficiently ensured in the junction between the ceramic base and the airtight sealing member (or the junction between the first and second ceramic bodies). Further, the joining material can be prevented from vaporization while chemical joining and mechanical (structural) joining can be combined with each other in the joining layer by employing the structure of engaging either the ceramic base or the airtight sealing member (or either one of the first and second ceramic bodies) in the counterbored groove as the structure of the junction, whereby a proper joining layer can be obtained. Consequently, reliability of the joining layer is improved.

In the ceramic joined body according to the aforementioned fourth or fifth aspect, the first ceramic body may have an electric circuit. The ceramic joined body according to the aforementioned fourth or fifth aspect may further comprise a feeding conductive member connected to the electric circuit of the first ceramic body. The second ceramic body is preferably arranged to enclose the feeding conductive member.

In this case, the second ceramic body acting as an airtight sealing member protecting the feeding conductive member is joined to the first ceramic body with no leak, whereby the inner part of the second ceramic body can be prevented from external penetration of reaction gas or the like. Consequently, such a failure can be reliably prevented that the feeding conductive member is corroded by reaction gas or the like outside the ceramic joined body.

A substrate processing apparatus according to a sixth aspect of the present invention comprises the ceramic joined body according to the aforementioned fourth or fifth aspect.

In this case, a ceramic joined body having neither leak nor deformation can be utilized for a substrate holding structure or the like of the substrate processing apparatus. Therefore, a problem such as corrosion of the feeding conductive member by reaction gas or dispersion of temperature distribution of a substrate resulting from deformation of the substrate holding structure can be prevented in the substrate processing apparatus.

BEST MODES FOR CARRYING OUT THE INVENTION

Figure 1:
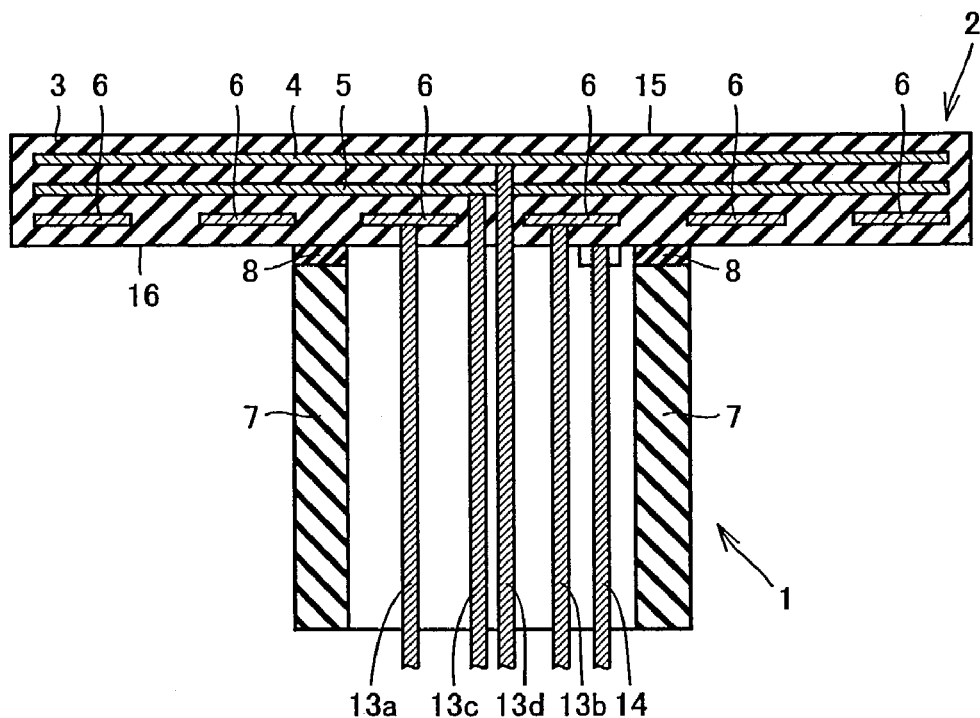
FIG. 1 is a schematic sectional view showing a holder serving as a substrate support structure according to the present invention.

An embodiment of the present invention is now described with reference to drawings. Portions identical or corresponding to each other in the following drawings are denoted by the same reference numerals, and redundant description is not repeated.

A holder according to the present invention is described with reference to FIG. 1.

As shown in FIG. 1, a holder 1 comprises a ceramic base 2 and a protective cylinder 7 joined to the ceramic base 2 as an airtight sealing member. The ceramic base 2 and the protective cylinder 7 are joined to each other with a joining layer 8.

The ceramic base 2 serving as a first ceramic body includes a substrate base 3 consisting of ceramic such as aluminum nitride as well as resistance heating elements 6, a plasma electrode 5 and an electrostatic attraction or adsorption electrode 4 embedded in the substrate base 3. A high melting point metal such as tungsten or molybdenum can be employed as the material for the resistance heating elements 6, the plasma electrode 5 and the electrostatic attraction or adsorption electrode 4 forming an electric circuit. Electrode wires 13a to 13d for supplying power to the electric circuit and a thermocouple 14 serving as a temperature measuring member are arranged on the back surface 16 of the ceramic base 2. The electrode wires 13a to 13d and the thermocouple 14 are arranged in the protective cylinder 7 consisting of aluminum nitride.

A method of fabricating the holder 1 shown in FIG. 1 is now described. A method of fabricating the ceramic base 2 is not particularly restricted but the following method can be employed, for example:

First, a ceramic sintered body for defining the ceramic base 2 is prepared by an ordinary method. A conductive layer for forming the resistance heating elements and the like is pressure-applied to the surface of this ceramic sintered body and subjected to baking. A material prepared by adding an assistant for prompting calcination to material powder consisting of a high melting point metal such as tungsten or molybdenum or a metal such as a silver (Ag)-palladium (Pd) alloy, platinum (Pt) or a platinum (Pt)-gold (Au) alloy with addition of a solvent and a binder is employed as the material applied for forming the conductive layer. Another ceramic sintered body is arranged on the surface having the baked conductive layer through a joining material or the like, so that the ceramic sintered body and the aforementioned additional ceramic sintered body are heat-joined to each other. The ceramic sintered body and the aforementioned additional ceramic sintered body may alternatively be directly heat-joined to each other without arranging the joining material between the additional ceramic sintered body and the ceramic sintered body. Further, not the additional ceramic sintered body but a corrosion-resistant protective layer may be thickly applied onto the conductive layer and baked.

In place of the aforementioned step of pressure-applying and baking the conductive layer, a groove may be formed on the surface of the ceramic sintered body for arranging the resistance heating elements etc. in this groove. In this case, coils or wires consisting of a high melting point metal or metal foil members may be employed as the resistance heating elements. Further, the coils, the wires or the metal foil members may alternatively be directly arranged on the surface without forming the groove on the surface of the ceramic base dissimilarly to the above.

Further, a method of not forming the conductive layer after the ceramic sintered body is completely sintered as described above but arranging a conductive layer (with respect to a ceramic compact) before sintering the ceramic sintered body may be employed as follows: More specifically, a ceramic compact for forming the ceramic base 2 is first prepared. This ceramic compact is fabricated in the following method, for example: First, a sintering assistant, a binder and an organic solvent etc. are added to ceramic material powder at need, and mixed with each other in a ball mill or the like. Slurry prepared in this manner is sheet-formed by the doctor blade method. The ceramic compact for forming the ceramic base can be obtained by stacking such sheets.

Then, the conductive layer for defining the resistance heating elements 6 and the like is arranged on the surface of this ceramic compact. More specifically, an assistant for prompting calcination is added to material powder consisting of a high melting point metal such as tungsten or molybdenum or a metal such as a silver (Ag)-palladium (Pd) alloy, platinum (Pt) or a platinum (Pt)-gold (Au) alloy for serving as the main component of the resistance heating elements, followed by addition of a solvent, a binder and the like. The sintering assistant may not be added. The mixture of the material powder containing the solvent and the like is thickly applied to the surface of the ceramic compact. Another ceramic compact is arranged on the surface coated with the conductive layer for defining the resistance heating elements and the like. A joining material may or may not be arranged between the ceramic compact and the aforementioned additional ceramic compact. Thus, such a state can be implemented that the conductive layer for the resistance heating elements and the like is embedded in the ceramic compact. The ceramic sintered body can be obtained by simultaneously calcining the obtained ceramic compact in a non-oxidizing atmosphere at a prescribed temperature. The ceramic base 2 having a prescribed shape can be obtained by performing machining such as cutting, polishing, grinding or the like on the ceramic sintered body at need.

Alternatively, a groove may be formed on the surface of the ceramic compact for thickly applying the raw material for a conductive layer containing high melting point metal powder or the like in this groove. Metallic wires or coils or metal foil members for defining the resistance heating elements and the like may be arranged in this groove. These coils or wires may alternatively be arranged on the surface of the compact formed with no groove. The ceramic base 2 can be obtained by arranging another compact on the surface provided with the conductive layer and thereafter performing prescribed heat treatment or the like as described above.

Further alternatively, a sintered body having a metal layer formed on the surface of a ceramic sintered body may be prepared by arranging the aforementioned conductive layer on the surface of a compact of ceramic and thereafter performing prescribed heat treatment. After this heat treatment, a corrosion-resistant protective layer may be applied onto the surface formed with the conductive layer and baked by heat treatment. Further alternatively, the conductive layer and the protective layer may be baked in the same heat treatment step by adjusting components so that the baking temperatures for the conductive layer and the protective layer reach substantially identical temperature levels.

In the ceramic base 2 obtained in the aforementioned manner, strict dimensional accuracy is required as to a substrate receiving surface 15 receiving an object to be processed such as a substrate. In other words, warpage or swelling of the substrate receiving surface 15 must be minimized by warpage curing or polishing. As to a portion for connecting the protective cylinder 7 to the ceramic base 2, therefore, the protective cylinder 7 is joined to the back surface 16 opposite to the substrate receiving surface 15 in the ceramic base 2. A material similar to that for the ceramic base 2 is preferably employed as the material for the protective cylinder 7.

As to a method of joining the protective cylinder 7 serving as a second ceramic body to the ceramic base 2, the surface of the portion joined to the protective cylinder 7 is smoothed by polishing on the back surface 16 of the ceramic base 2 serving as a joined surface. Also in the protective cylinder 7, an end surface connected to the ceramic base 2 is smoothed by polishing. A joining material is applied onto the surface of the ceramic base 2 joined to the protective cylinder 7, the end surface of the protective cylinder 7 joined to the ceramic base 2, or both of the aforementioned surfaces.

As to the composition of the joining material, it is preferable that the content of a rare earth oxide is at least 2 mass % and not more than 70 mass %, the content of aluminum oxide is at least 2 mass % and not more than 78 mass %, and the content of aluminum nitride is at least 2 mass % and not more than 50 mass %. As to the composition of the joining material, it is more preferable that the content of the rare earth oxide is at least 10 mass % and not more than 50 mass %, the content of the aluminum oxide is at least 30 mass % and not more than 70 mass %, and the content of the aluminum nitride is at least 10 mass % and not more than 30 mass %.

Drying is performed while pressing the joined surface (the end surface) of the protective cylinder 7 against a prescribed region of the back surface 16 of the ceramic base 2. At this time, the protective cylinder 7 may be pressed against the prescribed region of the ceramic base 2 after previously drying the joining material. In order to prevent displacement of relative positions of the ceramic base 2 and the protective cylinder 7, the ceramic base 2 and the protective cylinder 7 are fixed with a jig. At this time, a load (pressure) applied to the jig for fixing is set to not more than 0.1 MPa (1 kgf/cm$^2$). Heat treatment is performed with application of such a low load. The temperature condition for the heat treatment is 1650° C. to 1800° C., and the holding time is set to about 1 to 6 hours. The holder 1 having the protective cylinder 7 and the ceramic base 2 connected with each other by the joining layer 8 formed by heating/calcining the joining material can be obtained according to this heat treatment.

When the content of the rare earth oxide is in the range of at least 2 mass % and not more than 70 mass %, the content of the aluminum oxide is in the range of at least 2 mass % and not more than 78 mass % and the content of the aluminum nitride is in the range of at least 2 mass % and not more than 50 mass % in the joining layer 8, the ceramic base 2 and the protective cylinder 7 can be closely connected with each other with no clearances or the like defined in the joining layer 8. According to the joining layer 8 having the aforementioned composition, the holder 1 having substantially no leak (the leak rate of He is not more than 1×10$^{-8}$ Pa·m$^3$/s) of gas in the joining layer 8 can be obtained.

When the content of the rare earth oxide is at least 10 mass % and not more than 50 mass %, the content of the aluminum oxide is at least 30 mass % and not more than 70 mass % and the content of the aluminum nitride is at least 10 mass % and not more than 30 mass % in the joining layer 8, the leak rate in the joining layer 8 can be further reduced while the ceramic base 2 and the protective cylinder 7 can be more strongly connected with each other. When the ceramic base 2 and the protective cylinder 7 are joined to each other with the joining layer 8 having such a composition, the incidence of leak in the joining layer 8 can be remarkably reduced after carrying out a heat cycle for increasing the temperature from the room temperature to 700° C., for example. The ratio of occurrence of a failure such as heterogeneous joining resulting in local clearances in the joining layer 8 can also be remarkably reduced.

If the content of the rare earth oxide is at least 20 mass % and not more than 40 mass %, the content of the aluminum oxide is at least 40 mass % and not more than 60 mass % and the content of the aluminum nitride is at least 10 mass % and not more than 30 mass % in the joining layer 8, the leak rate in the joining layer 8 can be further reduced.

In the holder 1 according to the present invention obtained in the aforementioned manner, the joining layer 8 contains aluminum nitride grains formed by precipitation of aluminum nitride due to dissolution-reprecipitation. Therefore, grain boundary strength of the joining layer 8 can be improved. As to the junction of the holder 1 according to the present invention with the joining layer 8, four-point bending strength according to JIS is at least 147 MPa (15 kgf/mm$^2$).

A modification of the holder according to the present invention is now described with reference to FIG. 2.

Figure 2:
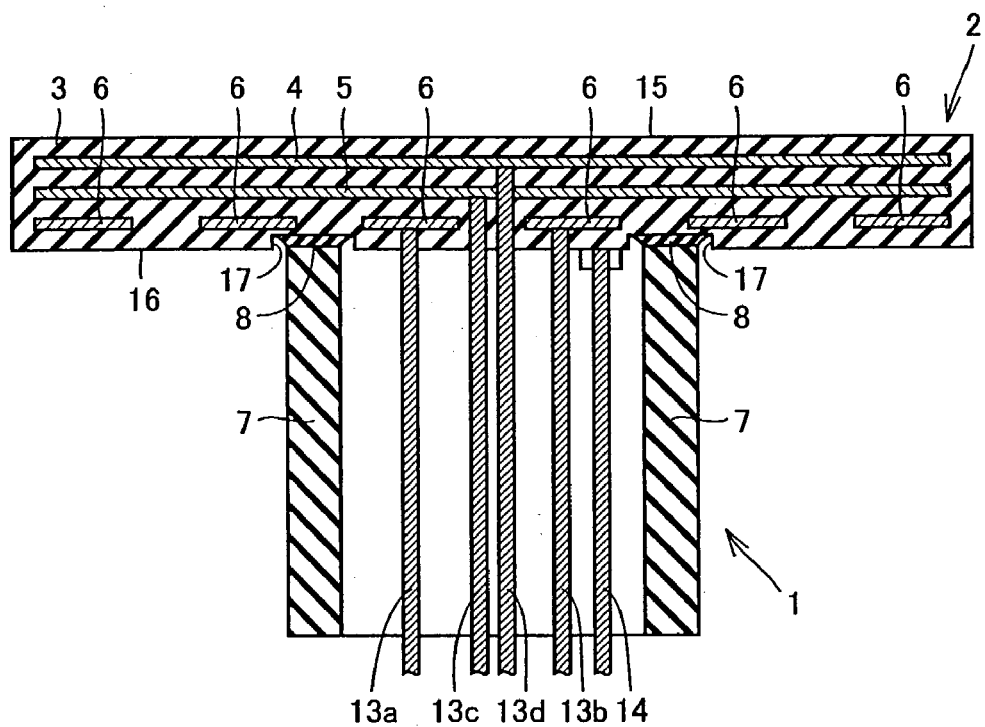
FIG. 2 is a schematic sectional view showing a modification of the holder shown in FIG. 1.

As shown in FIG. 2, a holder 1 has a structure basically similar to that of the holder 1 shown in FIG. 1, while the structure of a junction between a ceramic base 2 and a protective cylinder 7 is different. In the holder 1 shown in FIG. 2, a counterbored groove 17 is formed in the surface of the ceramic base 2 on the junction between the ceramic base 2 and the protective cylinder 7. The protective cylinder 7 is arranged to be engaged in the counterbored groove 17. The protective cylinder 7 is joined to the bottom wall of the counterbored groove 17 through a joining layer 8.

Thus, an effect similar to that of the holder 1 shown in FIG. 1 can be attained. Further, vaporization of a joining material for defining the joining layer 8 can be suppressed when forming the junction while chemical joining and mechanical joining for engaging the protective cylinder 7 in the counterbored groove 17 can be combined with each other, whereby reliability of the joining layer 8 can be improved.

The counterbored groove 17, formed on the back surface 16 of the ceramic base 2 in FIG. 2, may alternatively be formed on the upper surface (the surface opposed to the ceramic base 2) of the protective cylinder 7. In this case, a projecting portion is preferably formed on the portion of the back surface 16 of the ceramic base 2 coming into contact with the upper surface of the protective cylinder 7, to be engaged in the aforementioned counterbored groove. An effect similar to the above can be attained also in this case.

EXAMPLE 1

In order to confirm the effect of the present invention, the following experiment was made: First, each sample of a ceramic base was prepared through the following steps: First, raw material prepared by mixing 0.5 mass % of yttria ($Y_2O_3$) serving as a sintering assistant into aluminum nitride powder, adding polyvinyl alcohol as a binder and mixing ethanol as a solvent was dispersively mixed in a ball mill. This powder mixture was subjected to spray drying. The dried material powder was press-molded so that the diameter was 350 mmϕ and the thickness was 7 mm after sintering, thereby obtaining a compact. This compact was degreased in nitrogen gas under a condition of a temperature of 800° C. Thereafter the degreased compact was sintered under a condition of a temperature of 1850° for 4 hours, thereby obtaining a sintered body of aluminum nitride. The upper and lower surfaces of the obtained sintered body were polished with diamond abrasive grains. Consequently, the thickness of the sintered body was reduced to 6 mm.

A conductive layer for defining resistance heating elements was applied to one of the polished surfaces of the sintered body. The conductive layer was prepared by kneading tungsten powder and a calcination assistant with an ethyl cellulose binder. A triparallel linear pattern having three parallel linear patterns with a width of 5 mm and a distance of 0.5 mm between adjacent ones of the linear patterns was employed as the printing pattern for the conductive layer for defining the resistance heating elements. This linear pattern was spirally printed/applied substantially to the overall single surface of the sintered body. The thickness of the printed/applied conductive layer was set to 40 μm. In this printing pattern, a terminal part having a diameter of 6 mm was formed also by printing/application on an end portion.

The sintered body of aluminum nitride formed with the printing pattern for the conductive layer in the aforementioned manner was degreased in nitrogen gas under a temperature condition of 800° C. Thereafter calcination was performed under conditions of a temperature of 1700° C. and atmospheric gas of nitrogen gas. Thus, an aluminum nitride sintered body formed with a heater circuit pattern consisting of the conductive layer mainly composed of tungsten as the resistance heating elements was prepared.

In the aforementioned aluminum nitride sintered body, a protective layer was further formed on the surface formed with the heater circuit pattern. As to this protective layer, protective layer material was prepared by adding 0.5 mass % of powder of yttria ($Y_2O_3$) and 0.5 mass % of alumina ($Al_2O_3$) powder to powder of aluminum nitride and thereafter kneading the same with addition of an ethyl cellulose binder. This protective layer material was applied onto the surface of the aluminum nitride sintered body formed with the heater circuit pattern. The aluminum sintered body coated with the protective layer material was degreased under a temperature condition of 900° C. with atmospheric gas of nitrogen gas. Thereafter the sintered body was heated in nitrogen gas under a condition of a temperature of 1750° C., thereby forming the protective layer on the heater circuit pattern. The sample of the ceramic base was obtained in this manner. While the protective layer was basically formed on the overall surface, an opening was formed only on a terminal part to expose the terminal part of the heater circuit pattern.

A plurality of such samples of ceramic bases were prepared. A protective cylinder was prepared to be joined to each ceramic base. A cylindrical member having an outer peripheral diameter of 80 mm and an inner peripheral diameter of 50 mm was prepared as the protective cylinder.

Each joining layer having a composition shown in Table 1 was applied to the surface of the protective cylinder joined to the ceramic base and dried. The joining layer was prepared through the following steps: First, $Y_2O_3$ powder, $Al_2O_3$ powder, aluminum nitride (AlN) powder and $Sm_2O_3$ powder shown in Table 1 were mixed with each other in a ball mill. The powder mixture was dried and thereafter further kneaded with addition of an ethyl cellulose binder, for preparing the material for the joining layer.

The material for the joining layer was printed/applied onto the surface of the protective cylinder joined to the ceramic base, and thereafter dried. Thereafter the protective cylinder provided with the joining layer was heated in a nitrogen atmosphere under a temperature condition of 850° C., thereby performing debindering. The surface of the protective cylinder coated with the joining layer was brought into contact with the ceramic base. The ceramic base and the protective cylinder were fixed in a state joined to each other with a registration jig for the ceramic base and the protective cylinder. The joint sample of the ceramic base and the protective cylinder was arranged in a heating furnace while applying a load (pressure) of about 0.01 MPa (0.1 kgf/cm$^2$) to the junction. Heat treatment was performed in a nitrogen atmosphere under a temperature condition of 1780° C. for one hour. 10 samples corresponding to conditions of each sample were prepared as to each of samples Nos. 1 to 15 shown in Table 1.

Figure 3:
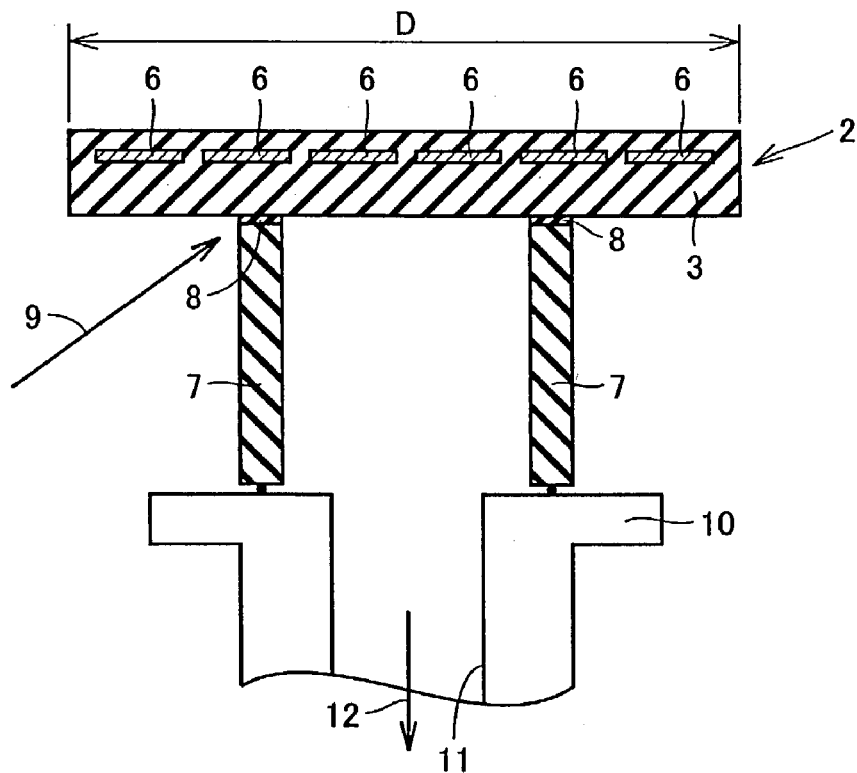
FIG. 3 is a model diagram for illustrating a helium leak test.
Figure 4:
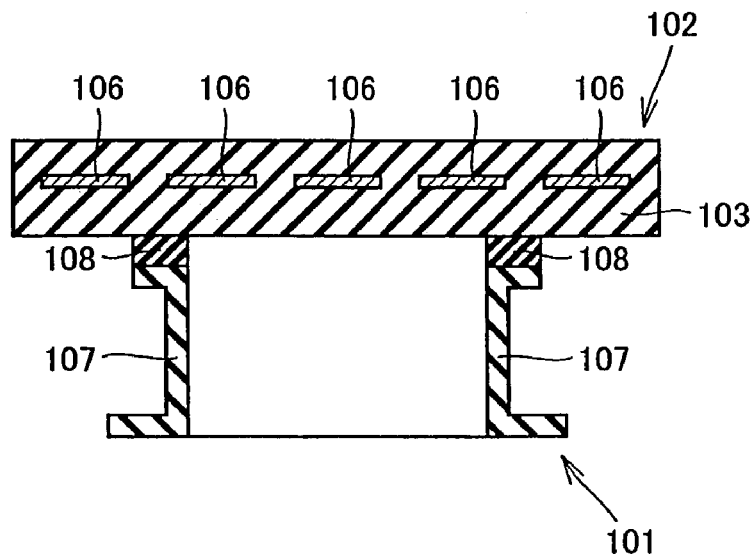
FIG. 4 is a schematic sectional view showing a conventional holder consisting of a substrate holder and a protective member.

A helium leak test was executed on each sample prepared in the aforementioned manner as shown in FIG. 3.

Referring to FIG. 3, the sample prepared by joining a protective cylinder 7 to a ceramic base 2 was arranged on a seat 10. The seat 10 is formed with an exhaust port 11. The junction between the protective cylinder 7 and the seat 10 was airtightly sealed with a sealing member. As shown in FIG. 2, helium 9 was applied to a joining layer 8 while gas was sucked from the protective cylinder 7 through the exhaust port 11 along arrow 12, for detecting the quantity of helium (He) contained in the sucked gas with a detector. A leak rate was measured in this manner.

As to joining strength of the junction, a test piece of 3×4×35 (mm) was cut out along the standard of a four-point bending test according to JIS after joining the protective cylinder 7 to the ceramic base 2, for performing the bending test on this test piece. Table 1 shows the results.

TABLE 1

| Comparative Example Indication Column (*: comparative example) | No. | Composition (mass %) | | | | Counter-boring | Joining Condition 1780° C. × 1 h | | | Deformation of Holding Part | Bending Strength (MPa(kgf/min²)) |
|---|---|---|---|---|---|---|---|---|---|---|---|
| | | $Y_2O_3$ | $Sm_2O_3$ | $Al_2O_3$ | AlN | | Leak Rate (Pa·m³/s) | | Determination | | |
| | | | | | | | a | b | | | |
| * | 1 | 38 | 0 | 63 | 0 | no | unmeasurable | | X | ○ | 0(0) |
| * | 2 | 37 | 0 | 62 | 1 | no | 7 | −6 | X | ○ | 29(3) |
|   | 3 | 38 | 0 | 61 | 3 | no | 9 | −9 | ○ | ○ | 147(15) |
|   | 4 | 35 | 0 | 58 | 8 | no | 6 | −9 | ○ | ○ | 167(17) |
|   | 5 | 33 | 0 | 55 | 12 | no | 2 | −9 | ○ | ○ | 245(25) |
|   | 6 | 30 | 0 | 50 | 20 | no | 7 | −10 | ○ | ○ | 245(25) |
|   | 7 | 27 | 0 | 45 | 28 | no | 1 | −9 | ○ | ○ | 235(24) |
|   | 8 | 26 | 0 | 43 | 32 | no | 6 | −9 | ○ | ○ | 186(19) |
|   | 9 | 21 | 0 | 34 | 45 | no | 8 | −9 | ○ | ○ | 177(18) |
|   | 10 | 20 | 0 | 33 | 48 | no | 9 | −9 | ○ | ○ | 147(15) |
| * | 11 | 18 | 0 | 30 | 52 | no | 8 | −7 | X | ○ | 88(9) |
| * | 12 | 13 | 0 | 22 | 65 | no | unmeasurable | | X | ○ | 59(6) |
| * | 13 | 9 | 0 | 16 | 75 | no | unmeasurable | | X | ○ | 20(2) |
| * | 14 | 6 | 0 | 9 | 85 | no | unmeasurable | | X | ○ | 0(0) |
| * | 15 | 1 | 0 | 2 | 97 | no | unmeasurable | | X | ○ | 0(0) |

| Comparative Example Indication Column (*: comparative example) | No. | Joining Condition 1830° C. × 1 h | | | Deformation of Holding Part | Bending Strength (MPa(kgf/min²)) |
|---|---|---|---|---|---|---|
| | | Leak Rate (Pa·m³/s) | | Determination | | |
| | | a | b | | | |
| * | 1 | unmeasurable | | X | X | — |
| * | 2 | 9 | −9 | ○ | X | — |
|   | 3 | — | — | — | — | — |
|   | 4 | — | — | — | — | — |
|   | 5 | — | — | — | — | — |
|   | 6 | — | — | — | — | — |
|   | 7 | — | — | — | — | — |
|   | 8 | — | — | — | — | — |
|   | 9 | — | — | — | — | — |
|   | 10 | — | — | — | — | — |
| * | 11 | 8 | −9 | ○ | X | — |
| * | 12 | 7 | −7 | X | X | . |
| * | 13 | unmeasurable | | X | X | — |
| * | 14 | unmeasurable | | X | X | — |
| * | 15 | unmeasurable | | X | X | . | leak rate notation: $a \times 10^b$

As shown in Table 1, it is understood that each of the samples Nos. 3 to 10 corresponding to the embodiment of the present invention exhibited a leak rate of less than $1\times10^{-8}$ Pa·m$^3$/s also in the aforementioned helium leak test and has sufficient airtightness. It is also understood that each of the samples Nos. 1, 2 and 11 to 15 according to comparative example had a leak rate larger than that of each of the samples Nos. 3 to 10 according to Example of the present invention and had insufficient airtightness. Thus, airtightness in the joining layer 8 can be kept sufficiently high according to the present invention.

As to each of the samples having leak rates exceeding $1\times10^{-8}$ Pa·m$^3$/s, another sample was prepared by further performing heat treatment on the sample of the joined body of the ceramic base and the protective cylinder in a nitrogen atmosphere under a temperature condition of 1830° C. for a treatment time of one hour for executing the aforementioned helium leak test. Table 1 also shows the results. In this case, the samples Nos. 2 and 11 exhibited sufficient numerical values of leak rates of $1\times10^{-8}$ Pa·m$^3$/s in the point of evaluation of airtightness, while the junctions and ceramic substrates were deformed. Consequently, flatness etc. of the substrate receiving surfaces of the ceramic bases were deteriorated.

Table 1 also shows evaluation results as to presence/absence of deformation of the ceramic base 2 after heat treatment of each sample with ○ and x in the columns of holding parts. ○ in the columns of holding parts shows that the ceramic bases were not deformed, and x shows that the ceramic bases were deformed. As to the description of the columns of leak rates, the indication of the leak rate as to the sample 3 subjected to heat treatment of 1780° C.×1 h., for example, shows a value $9\times10^{-9}$ Pa·m$^3$/s.

As to the strength of the joined body, each of the samples Nos. 3 to 10 had sufficiently practical strength of at least 147 MPa (15 kgf/mm$^2$) as a result of a four-point bending test when subjected to heat treatment of 1780° C.×1 h (time). In particular, the samples Nos. 5 to 7 having the contents of aluminum nitride of at least 10 mass % and not more than 30 mass % had sufficient strength of at least 196 MPa (20 kgf/mm$^2$). As to the description of the columns of bending strength, description of 147 (15) shows that the bending strength is 147 MPa (15 kgf/mm$^2$) as to the sample No. 3, for example.

EXAMPLE 2

While the joining layer contained Y$_2$O$_3$ as the main component in Example 1, a test similar to that in Example 1 was performed as to a case of employing a joining layer containing Sm$_2$O$_3$ as the component thereof. Table 2 shows the compositions of joining layers in samples employed for the test and the results of this test. The method of fabricating the samples and the experimental method are basically similar to those in Example 1.

TABLE 2

| Comparative Example Indication Column (*: comparative example) | | Composition (mass %) | | | | | Joining Condition 1780° C. × 1 h | | | | |
|---|---|---|---|---|---|---|---|---|---|---|---|
| | No. | Y$_2$O$_3$ | Sm$_2$O$_3$ | Al$_2$O$_3$ | AlN | Counter-boring | Leak Rate Pa·m$^3$/s a | b | Determination | Deformation of Holding Part | Bending Strength (MPa(kgf/min$^2$)) |
| | 16 | 0 | 30 | 50 | 20 | no | 8 | −10 | ○ | ○ | 245(25) |
| | 17 | 0 | 20 | 33 | 48 | no | 7 | −9 | ○ | ○ | 157(16) |

| Comparative Example Indication Column (*: comparative example) | No. | Joining Condition 1830° C. × 1 h | | | | |
|---|---|---|---|---|---|---|
| | | Leak Rate (Pa·m$^3$/s) a | b | Determination | Deformation of Holding Part | Bending Strength (MPa/kgf/min$^2$)) |
| | 16 | — | — | — | — | — |
| | 17 | — | — | — | — | . | leak rate notation: a × 10$^b$

Referring to Table 2, it was possible to implement sufficiently high airtightness in the joining layer with no inconvenience such as deformation in a ceramic base in each of samples Nos. 16 and 17 corresponding to Example of the present invention. Also as to the strength of a joined body, the sample No. 16 had practical strength of at least 147 MPa (15 kgf/mm$^2$) due to heat treatment of 1780° C.×1 h. Further, the sample No. 17 having a content of aluminum nitride in the joining layer within the range of at least 10 mass % and not more than 30 mass % had sufficient strength of at least 196 MPa (20 kgf/mm$^2$).

EXAMPLE 3

Then, influence in a case of varying the contents of yttria (Y$_2$O$_3$) and alumina (Al$_2$O$_3$) while keeping the content of aluminum nitride (AlN) substantially constant in the composition of a joining layer was evaluated by a test similar to that in Example 1 of the present invention. Table 3 shows the compositions of joining layers and experimental results.

TABLE 3

| Comparative Example Indication Column (*: comparative example) | No. | Composition (mass %) Y$_2$O$_3$ | Sm$_2$O$_3$ | Al$_2$O$_3$ | AlN | Counter-boring | Joining Condition 1780° C. × 1 h Leak Rate (Pa · m$^3$/s) a | b | Determination | Deformation of Holding Part | Bending Strength (MPa(kgf/min$^2$)) |
|---|---|---|---|---|---|---|---|---|---|---|---|
| * | 18 | 0 | 0 | 74 | 20 | no | unmeasurable | | X | ○ | 0(0) |
| * | 19 | 1 | 0 | 79 | 20 | no | 5 | −6 | X | ○ | 69(7) |
|   | 20 | 2 | 0 | 78 | 20 | no | 9 | −9 | ○ | ○ | 235(24) |
|   | 21 | 8 | 0 | 72 | 20 | no | 6 | −9 | ○ | ○ | 245(25) |
|   | 22 | 12 | 0 | 68 | 20 | no | 1 | −9 | ○ | ○ | 226(23) |
|   | 6 | 30 | 0 | 50 | 20 | no | 7 | −10 | ○ | ○ | 245(25) |
|   | 23 | 48 | 0 | 32 | 20 | no | 3 | −9 | ○ | ○ | 255(26) |
|   | 24 | 52 | 0 | 28 | 20 | no | 7 | −9 | ○ | ○ | 245(25) |
|   | 25 | 65 | 0 | 15 | 20 | no | 9 | −9 | ○ | ○ | 255(26) |
| * | 26 | 72 | 0 | 8 | 20 | no | 7 | −7 | X | ○ | 245(25) |
| * | 27 | 77 | 0 | 3 | 20 | no | unmeasurable | | X | ○ | 255(26) |

| Comparative Example Indication Column (*: comparative example) | No. | Joining Condition 1830° C. × 1 h Leak Rate (Pa · m$^3$/s) a | b | Determination | Deformation of Holding Part | Bending Strength (MPa(kgf/min$^2$)) |
|---|---|---|---|---|---|---|
| * | 18 | unmeasurable | | X | X | — |
| * | 19 | 6 | −8 | X | X | — |
|   | 20 | — | — | — | — | — |
|   | 21 | — | — | — | — | — |
|   | 22 | — | — | — | — | — |
|   | 6 | — | — | — | — | — |
|   | 23 | — | — | — | — | — |
|   | 24 | — | — | — | — | — |
|   | 25 | — | — | — | — | — |
| * | 26 | 8 | −9 | ○ | X | — |
| * | 27 | 7 | −8 | X | X | . | leak rate notation: a × 10$^b$

As shown in Table 3, it is understood that each of samples Nos. 20 to 25 corresponding to Example of the present invention exhibited sufficiently high airtightness with no deformation of a ceramic base or the like. It is also understood that the quantity of leak was increased and airtightness was lower than that in Example of the present invention in each of samples Nos. 18, 19 and 26 according to comparative example.

As to samples created under conditions setting the temperature for heat treatment to 1830° C. while setting the heating time to one hour in relation to comparative samples Nos. 18, 19, 26 and 27, airtightness was relatively improved only as to the sample No. 26 but deformation of the ceramic base etc. took place and hence it is understood that it is difficult to prevent the substrate receiving surface of the ceramic base from deformation and implement high airtightness in the joining layer 8 according to the prior art. Also as to the strength of the joined body, it is understood that each of the samples Nos. 20 to 25 exhibited sufficient strength of at least 196 MPa (20 kgf/mm$^2$) due to heat treatment of 1780° C.×1 h.

EXAMPLE 4

A sample No. 28 was prepared with a composition of a joining layer and joining conditions similar to those of the sample No. 6 except that working (counterboring) of forming a counterbored groove of 0.5 mm in depth in a ceramic base of a junction was performed. A test similar to that in Example 1 was performed on this sample No. 28. Table 4 shows the results.

TABLE 4

| Comparative Example Indication Column (*: comparative example) | | Composition (mass %) | | | | Joining Condition 1780° C. × 1 h | | | | | |
|---|---|---|---|---|---|---|---|---|---|---|---|
| | No. | Y$_2$O$_3$ | Sm$_2$O$_3$ | Al$_2$O$_3$ | AlN | Counter-boring | Leak Rate (Pa · m$^3$/s) a | b | Determination | Deformation of Holding Part | Bending Strength (MPa(kgf/min$^2$)) |
| | 28 | 30 | 0 | 50 | 20 | yes | 5 | −10 | ○ | ○ | 294(30) |

| Comparative Example Indication Column (*: comparative example) | | Joining Condition 1830° C. × 1 h | | | | |
|---|---|---|---|---|---|---|
| | No. | Leak Rate (Pa · m$^3$/s) a | b | Determination | Deformation of Holding Part | Bending Strength (MPa(kgf/min$^2$)) |
| | 28 | — | — | — | — | . | leak rate notation: a × 10$^b$

As shown in Table 4, it is understood that the sample No. 28 exhibited sufficiently high airtightness with no deformation of a ceramic. base or the like. Also as to the strength of the joined body, the sample No. 28 exhibited the highest strength of 294 MPa (30 kgf/mm$^2$) among those of the samples prepared this time, when subjected to heat treatment of 1780° C.×1 h.

The embodiment and Examples disclosed this time must be considered illustrative in all points and not restrictive. The scope of the present invention is shown not by the aforementioned embodiment and Examples but by the scope of the claims for patent, and it is intended that all modifications within the meaning and range equivalent to the scope of the claims for patent are included.

INDUSTRIAL AVAILABILITY

The present invention is applicable to a substrate holder holding a semiconductor substrate or a glass substrate in etching or film formation for fabricating a semiconductor device or a liquid crystal display, and particularly suitably applied to a substrate holder comprising a heating member or a cooling member controlling the temperature of the semiconductor substrate or the glass substrate.

The invention claimed is:

1. A substrate holding structure adapted to hold a substrate when processing the substrate, comprising:
  a ceramic base adapted to hold the substrate and including a ceramic member and an electric circuit element;
  an electricity feeding conductive member connected to said electric circuit element;
  an airtight sealing member joined to said ceramic base and enclosing said conductive member; and
  a joining layer that is positioned between said ceramic base and said airtight sealing member and joins said ceramic base and said airtight sealing member to each other, and that exhibits a helium leak rate of less than 1.0×10$^{-8}$ Pa·m$^3$/s therethrough;
  wherein:
  said joining layer consists of:
    at least 2 mass % and not more than 70 mass % of a rare earth oxide,
    at least 10 mass % and not more than 78 mass % of aluminum oxide, and
    at least 2 mass % and not more than 50 mass % of aluminum nitride including aluminum nitride grains formed by precipitation of said aluminum nitride resulting from dissolution-reprecipitation;
  said aluminum oxide has the largest proportional content among said rare earth oxide, said aluminum oxide and said aluminum nitride in said joining layer.

2. The substrate holding structure according to claim 1, wherein, in said joining layer,
  the content of said rare earth oxide is at least 10 mass % and not more than 50 mass %,
  the content of said aluminum oxide is at least 30 mass % and not more than 70 mass %, and
  the content of said aluminum nitride is at least 10 mass % and not more than 30 mass %.

3. The substrate holding structure according to claim 1, wherein said joining layer has a four-point bending strength of at least 147 MPa according to JIS.

4. The substrate holding structure according to claim 1, wherein
  a counterbored groove is formed in a first one of said ceramic base and said air tight sealing member at a junction between said ceramic base and said airtight sealing member, and
  said ceramic base and said airtight sealing member are joined to each other while an other second one of said ceramic base and said airtight sealing member is engaged in said counterbored groove.

5. A substrate processing apparatus comprising the substrate holding structure according to claim 1.

6. The substrate holding structure according to claim 1, wherein said joining layer is formed by sintering a joining material containing a sintering assistant that excludes an alkaline earth element.

7. A substrate holding structure adapted to hold a substrate when processing the substrate, comprising:
  a ceramic base adapted to hold the substrate and including a ceramic member and an electric circuit element;
  an electricity feeding conductive member connected to said electric circuit element;

an airtight sealing member joined to said ceramic base and enclosing said conductive member; and a joining layer that is positioned between said ceramic base and said airtight sealing member and joins said ceramic base and said airtight sealing member to each other, and that exhibits a helium leak rate of less than $1.0\times10^{-8}$ Pa·m$^3$/s therethrough;

wherein:

said joining layer is formed by heating/calcining a joining material to form said joining layer consisting of:
 at least 2 mass % and not more than 70 mass % of a rare earth oxide,
 at least 10 mass % and not more than 78 mass % of aluminum oxide, and
 at least 2 mass % and not more than 50 mass % of aluminum nitride including aluminum nitride grains formed by precipitation of said aluminum nitride resulting from dissolution-reprecipitation;

said aluminum oxide has the largest proportional content among said rare earth oxide, said aluminum oxide and said aluminum nitride in said joining layer.

8. The substrate holding structure according to claim 7, wherein said joining layer is formed by heating/calcining said joining material containing at least 10 mass % and not more than 50 mass % of said rare earth oxide, at least 30 mass % and not more than 70 mass % of said aluminum oxide, and at least 10 mass % and not more than 30 mass % of said aluminum nitride.

9. The substrate holding structure according to claim 7, wherein said joining material contains a sintering assistant that excludes an alkaline earth element.

10. A ceramic joined body comprising:
a first ceramic body including a ceramic member and an electric circuit element;
an electricity feeding conductive member connected to said electric circuit element;
a second ceramic body joined to said first ceramic body and enclosing said conductive member; and
a joining layer that is positioned between said first ceramic body and said second ceramic body and joins said first ceramic body and said second ceramic body to each other, and that exhibits a helium leak rate of less than $1.0\times10^{-8}$ Pa·m$^3$/s therethrough;

wherein:

said joining layer consists of:
 at least 2 mass % and not more than 70 mass % of a rare earth oxide,
 at least 10 mass % and not more than 78 mass % of aluminum oxide, and
 at least 2 mass % and not more than 50 mass % of aluminum nitride including aluminum nitride grains formed by precipitation of said aluminum nitride resulting from dissolution-reprecipitation;

said aluminum oxide has the largest proportional content among said rare earth oxide, said aluminum oxide and said aluminum nitride in said joining layer.

11. The ceramic joined body according to claim 10, wherein, in said joining layer,
the content of said rare earth oxide is at least 10 mass % and not more than 50 mass %,
the content of said aluminum oxide is at least 30 mass % and not more than 70 mass %, and
the content of said aluminum nitride is at least 10 mass % and not more than 30 mass %.

12. The ceramic joined body according to claim 10, wherein said joining layer has a four-point bending strength of at least 147 MPa according to JIS.

13. The ceramic joined body according to claim 10, wherein
a counterbored groove is formed in either one of said first and second ceramic bodies at a junction between said first ceramic body and said second ceramic body, and
said first ceramic body and said second ceramic body are joined to each other while the other one of said first and second ceramic bodies is engaged in said counterbored groove.

14. The ceramic joined body according to claim 10, wherein the content of said rare earth oxide in said joining layer is not more than 35 mass %.

15. The ceramic joined body according to claim 10, wherein the content of said aluminum oxide in said joining layer is at least 34 mass %.

16. The ceramic joined body according to claim 10, wherein the content of said aluminum nitride in said joining layer is no more than 20 mass %.

17. The ceramic joined body according to claim 10, wherein said rare earth oxide comprises $Sm_2O_3$.

18. A substrate processing apparatus comprising the ceramic joined body according to claim 10.

19. The ceramic joined body according to claim 10, wherein said joining layer is formed by sintering a joining material containing a sintering assistant that excludes an alkaline earth element.

20. A ceramic joined body comprising:
a first ceramic body including a ceramic member and an electric circuit element;
an electricity feeding conductive member connected to said electric circuit element;
a second ceramic body joined to said first ceramic body and enclosing said conductive member; and
a joining layer that is positioned between said first ceramic body and said second ceramic body and joins said first ceramic body and said second ceramic body to each other, and that exhibits a helium leak rate of less than $1.0\times10^{-8}$ Pa·m$^3$/s therethrough;

wherein:

said joining layer is formed by heating/calcining a joining material to form said joining layer consisting of:
 at least 2 mass % and not more than 70 mass % of a rare earth oxide,
 at least 10 mass % and not more than 78 mass % of aluminum oxide, and
 at least 2 mass % and not more than 50 mass % of aluminum nitride including aluminum nitride grains formed by precipitation of said aluminum nitride resulting from dissolution-reprecipitation;

said aluminum oxide has the largest proportional content among said rare earth oxide, said aluminum oxide and said aluminum nitride in said joining layer.

21. The ceramic joined body according to claim 20, wherein said joining layer is formed by heating/calcining said joining material containing at least 10 mass % and not more than 50 mass % of said rare earth oxide, at least 30 mass % and not more than 70 mass % of said aluminum oxide, and at least 10 mass % and not more than 30 mass % of said aluminum nitride.

22. The ceramic joined body according to claim 20, wherein said joining material contains a sintering assistant that excludes an alkaline earth element.

* * * * *

UNITED STATES PATENT AND TRADEMARK OFFICE
CERTIFICATE OF CORRECTION

PATENT NO. : 7,211,153 B2
APPLICATION NO. : 10/276394
DATED : May 1, 2007
INVENTOR(S) : Kuibira et al.

It is certified that error appears in the above-identified patent and that said Letters Patent is hereby corrected as shown below:

Column 6,
Line 43, after "can", replace "bell" by --be--;

Column 20, Table 1
In the Heading, of the twelfth column and of the last column, after "Bending Strength", (two occurrences) replace "(Mpa(kgf/min$^2$))" by --(MPa(kgf/mm$^2$))"--;

Column 22, Table 2
In the Heading, of the twelfth column and of the last column, after "Bending Strength", (two occurrences) replace "(Mpa(kgf/min$^2$))" by --(MPa(kgf/mm$^2$))"--;

Column 24, Table 3
In the Heading, of the twelfth column and of the last column, after "Bending Strength", (two occurrences) replace "(Mpa(kgf/min$^2$))" by --(MPa(kgf/mm$^2$))"--;

Column 25,
Line 27, after "ceramic", delete --.--;

Column 26, Table 4
In the Heading, of the twelfth column and of the last column, after "Bending Strength", (two occurrences) replace "(Mpa(kgf/min$^2$))" by --(MPa(kgf/mm$^2$))--;

Column 26,
Line 49, after "said" replace "air tight" by --airtight--.

Signed and Sealed this

Eighth Day of April, 2008

JON W. DUDAS
*Director of the United States Patent and Trademark Office*